(12) United States Patent
Park (10) Patent No.: US 10,366,728 B2
(45) Date of Patent: *Jul. 30, 2019

(54) METHODS AND APPARATUSES FOR PROVIDING A PROGRAM VOLTAGE RESPONSIVE TO A VOLTAGE DETERMINATION

(71) Applicant: MICRON TECHNOLOGY, INC., Boise, ID (US)

(72) Inventor: Jae-Kwan Park, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 4 days.

This patent is subject to a terminal disclaimer.

(21) Appl. No.: 15/910,375

(22) Filed: Mar. 2, 2018

(65) Prior Publication Data

US 2018/0197583 A1   Jul. 12, 2018

Related U.S. Application Data

(63) Continuation of application No. 15/610,281, filed on May 31, 2017, now Pat. No. 9,947,375, which is a
(Continued)

(51) Int. Cl.
*G11C 16/08* (2006.01)
*G11C 7/02* (2006.01)
(Continued)

(52) U.S. Cl.
CPC ............ *G11C 7/02* (2013.01); *G11C 16/0483* (2013.01); *G11C 16/08* (2013.01); *G11C 16/10* (2013.01); *G11C 16/3427* (2013.01)

(58) Field of Classification Search
CPC ...... G11C 16/0483; G11C 16/08; G11C 16/10
See application file for complete search history.

(56) References Cited

U.S. PATENT DOCUMENTS 4,792,928 A   12/1988   Tobita
4,884,238 A   11/1989   Lee et al.
(Continued)

FOREIGN PATENT DOCUMENTS

EP   1526548 A1   4/2005
WO   2014130315 A1   8/2014

OTHER PUBLICATIONS

U.S. Appl. No. 15/895,290, entitled "Appartuses, Circuits, and Methods for Biasing Signal Lines", filed Feb. 13, 2018, pp. all.
(Continued)

*Primary Examiner* — Hoai V Ho
*Assistant Examiner* — Jay W. Radke
(74) *Attorney, Agent, or Firm* — Dorsey & Whitney LLP (57) ABSTRACT

Apparatuses and methods for providing a program voltage responsive to a voltage determination are described. An example apparatus includes a memory array comprising a plurality of access lines. The example apparatus further includes a memory access circuit coupled to the memory array. The memory access circuit is configured to, during a memory program operation, provide an inhibit voltage to the plurality of access lines. The memory access circuit is further configured to, during the memory program operation, provide a program voltage to a target access line of the plurality of access lines responsive to a determination that an access line of the plurality of access lines has a voltage equal to or greater than a threshold voltage. The threshold voltage is less than the inhibit voltage.

20 Claims, 5 Drawing Sheets

Related U.S. Application Data continuation of application No. 14/165,389, filed on Jan. 27, 2014, now Pat. No. 9,672,875.

(51) Int. Cl.
   *G11C 16/04* (2006.01)
   *G11C 16/10* (2006.01)
   *G11C 16/34* (2006.01)

(56) References Cited

U.S. PATENT DOCUMENTS

| | | | |
|---|---|---|---|
| 4,926,387 A | 5/1990 | Madland | |
| 5,062,079 A | 10/1991 | Tsuchida et al. | |
| 5,130,580 A | 7/1992 | Min et al. | |
| 5,663,925 A | 9/1997 | Vo | |
| 6,088,279 A | 7/2000 | Ishii | |
| 6,181,626 B1 | 1/2001 | Brown | |
| 6,356,481 B1 | 3/2002 | Micheloni et al. | |
| 6,359,821 B1 | 3/2002 | Roohparvar | |
| 6,411,557 B2 | 6/2002 | Terizoglu et al. | |
| 6,456,557 B1 | 9/2002 | Dadashev et al. | |
| 6,490,199 B2 | 12/2002 | Lee et al. | |
| 6,857,449 B1 | 2/2005 | Chow | |
| 6,914,835 B2 | 7/2005 | Jeon et al. | |
| 7,099,204 B1 | 8/2006 | Wadhwa et al. | |
| 7,286,408 B1* | 10/2007 | Higashitani | G11C 16/3418 365/185.18 |
| 7,366,040 B2 | 4/2008 | Chen | |
| 7,414,904 B2 | 8/2008 | Ehrenreich et al. | |
| 7,450,427 B2 | 11/2008 | Yamada | |
| 7,529,135 B2 | 5/2009 | Pan et al. | |
| 7,577,049 B1 | 8/2009 | Kornachuk | |
| 7,706,201 B2 | 4/2010 | Liaw et al. | |
| 7,724,075 B2 | 5/2010 | Yang et al. | |
| 7,936,626 B2 | 5/2011 | Chen | |
| 7,990,773 B2 | 8/2011 | Tran et al. | |
| 8,040,723 B2 | 10/2011 | Sheu et al. | |
| 8,050,084 B2 | 11/2011 | Bae et al. | |
| 8,159,869 B2 | 4/2012 | Park et al. | |
| 8,228,709 B2 | 7/2012 | Choi et al. | |
| 8,254,180 B2 | 8/2012 | Moei et al. | |
| 8,353,540 B2 | 1/2013 | Nguyen | |
| 8,743,587 B2 | 6/2014 | Takase | |
| 8,767,494 B2 | 7/2014 | Yang et al. | |
| 8,824,191 B2 | 9/2014 | Samachisa et al. | |
| 8,885,399 B2 | 11/2014 | Storms et al. | |
| 9,042,190 B2 | 5/2015 | Vimercati et al. | |
| 9,105,328 B2 | 8/2015 | Chiu et al. | |
| 9,236,102 B2 | 1/2016 | Tiburzi et al. | |
| 9,368,202 B2 | 6/2016 | Vimercati et al. | |
| 9,418,716 B1 | 8/2016 | Palleria et al. | |
| 9,576,654 B2 | 2/2017 | Vimercati et al. | |
| 9,646,662 B2 | 5/2017 | Tiburzi et al. | |
| 9,672,875 B2 | 6/2017 | Park | |
| 9,916,880 B2 | 3/2018 | Tiburzi et al. | |
| 2003/0086304 A1 | 5/2003 | Park | |
| 2004/0174150 A1 | 9/2004 | Zhang et al. | |
| 2005/0117399 A1 | 6/2005 | Kwon et al. | |
| 2006/0081944 A1 | 4/2006 | Madan | |
| 2006/0181915 A1 | 8/2006 | Oh et al. | |
| 2006/0245260 A1 | 11/2006 | Kim | |
| 2006/0256620 A1 | 11/2006 | Nguyen et al. | |
| 2007/0002628 A1 | 1/2007 | Kim et al. | |
| 2007/0109862 A1 | 5/2007 | Kim et al. | |
| 2007/0140003 A1 | 6/2007 | Ido | |
| 2007/0211537 A1 | 9/2007 | Park et al. | |
| 2007/0258276 A1 | 11/2007 | Higashitani | |
| 2008/0037327 A1 | 2/2008 | Park et al. | |
| 2008/0043555 A1 | 2/2008 | Hold | |
| 2008/0089130 A1 | 4/2008 | Park | |
| 2008/0123436 A1 | 5/2008 | Byeon | |
| 2008/0205134 A1 | 8/2008 | Kato | |
| 2009/0003067 A1 | 1/2009 | Kang et al. | |
| 2009/0003077 A1 | 1/2009 | Lim | |
| 2009/0040833 A1 | 2/2009 | Shin et al. | |
| 2009/0052256 A1 | 2/2009 | Sutardja | |
| 2009/0080275 A1 | 3/2009 | Vo et al. | |
| 2009/0135651 A1 | 5/2009 | Kojima et al. | |
| 2009/0161411 A1 | 6/2009 | Kushida et al. | |
| 2009/0161433 A1 | 6/2009 | Lee et al. | |
| 2009/0168537 A1 | 7/2009 | Kim | |
| 2010/0027320 A1 | 2/2010 | Muraoka et al. | |
| 2010/0054064 A1 | 3/2010 | Miyakawa et al. | |
| 2010/0061162 A1 | 3/2010 | Burnett et al. | |
| 2010/0067308 A1 | 3/2010 | Tran et al. | |
| 2010/0110798 A1 | 5/2010 | Hoei et al. | |
| 2010/0214846 A1 | 8/2010 | Kim et al. | |
| 2010/0246259 A1 | 9/2010 | Kwon | |
| 2011/0032746 A1 | 2/2011 | Maejima et al. | |
| 2011/0063920 A1 | 3/2011 | Moschiano et al. | |
| 2011/0235398 A1 | 9/2011 | Hosono | |
| 2011/0292725 A1 | 12/2011 | Choi et al. | |
| 2012/0008384 A1 | 1/2012 | Li et al. | |
| 2012/0075931 A1 | 3/2012 | Yuh | |
| 2012/0087172 A1 | 4/2012 | Aoki | |
| 2012/0218817 A1 | 8/2012 | Kang et al. | |
| 2012/0218823 A1* | 8/2012 | Tanzawa | G11C 8/08 365/185.18 |
| 2013/0051147 A1 | 2/2013 | Iwai | |
| 2013/0155770 A1 | 6/2013 | Hirano | |
| 2013/0163320 A1 | 6/2013 | Lam et al. | |
| 2013/0201769 A1 | 8/2013 | Yang | |
| 2013/0242671 A1 | 9/2013 | Missiroli | |
| 2014/0010032 A1 | 1/2014 | Seshadri et al. | |
| 2014/0064010 A1 | 3/2014 | Barkley et al. | |
| 2014/0104922 A1 | 4/2014 | Tiburzi et al. | |
| 2014/0160856 A1 | 6/2014 | Joo | |
| 2014/0185361 A1 | 7/2014 | Oh et al. | |
| 2014/0241049 A1 | 8/2014 | Vimercati et al. | |
| 2014/0347912 A1 | 11/2014 | Siau et al. | |
| 2015/0213848 A1 | 7/2015 | Park | |
| 2015/0294717 A1 | 10/2015 | Vimercati et al. | |
| 2016/0118096 A1 | 4/2016 | Tiburzi et al. | |
| 2016/0254049 A1 | 9/2016 | Vimercati et al. | |
| 2017/0206942 A1 | 7/2017 | Tiburzi et al. | |
| 2017/0270976 A1 | 9/2017 | Park | |
| 2018/0174625 A1 | 6/2018 | Tiburzi et al. | |

OTHER PUBLICATIONS

Choi, Youngdon et al., "A 20nm 1.8V 8Gb PRAM with 40MB/s Program Bandwidth", IEEE International ISSCC 2012, Session 2, Feb. 2012, pp. all.

Son, Young-Suk et al., "A Gray-Level Dependent Pre-Emphasis Column Driver Wth Fast Settling for Active-Matrix LCD Application", IEEE Transactions on Circuits and Systems—II Express Briefs, vol. 54, No. 12, Dec. 2007, pp. all.

* cited by examiner

METHODS AND APPARATUSES FOR PROVIDING A PROGRAM VOLTAGE RESPONSIVE TO A VOLTAGE DETERMINATION

CROSS REFERENCE TO RELATED APPLICATION(S)

This application is a continuation of U.S. patent application Ser. No. 15/610,281, filed May 31, 2017, and issued as U.S. Pat. No. 9,947,375 on Apr. 17, 2018, which is a continuation of U.S. patent application Ser. No. 14/165,389, filed Jan. 27, 2014, and issued as U.S. Pat. No. 9,672,875 on Jun. 6, 2017. The aforementioned applications and issued patents are incorporated herein by reference, in their entirety, for any purpose.

DESCRIPTION OF RELATED ART

Advances in technology have resulted in high density memory architectures. Increased density of memory may lead to signal lines having smaller feature sizes, for example, longer, narrower signal lines, which results in increased inherent parasitic resistance along the signal lines. Further, reduced spacing between signal lines in high density architectures can also lead to increased parasitic capacitive coupling between the signal lines. The higher resistance and increased parasitic capacitive coupling between the signal lines may make programming and otherwise accessing memory cells through the signal lines more susceptible to errors.

A program operation typically includes applying an inhibit voltage (e.g. pass voltage) to all signal lines of a memory block for a predetermined period of time, followed by applying a program voltage to a target signal line after the predetermined length of time. As known, similar components can exhibit slightly different electrical response characteristics under similar conditions that may result from, for example, process variations. The predetermined length of time the inhibit voltage is applied may be set to reliably ensure that the signal lines are charged to the inhibit voltage before the program voltage is applied. However, due to the increased resistance and increased parasitic capacitive coupling between the signal lines that may exist in high density memory architectures, provision of the program voltage to a target signal line after the inhibit voltage has been applied to all of the signal lines can cause the signal lines adjacent to the target signal line to initially overshoot the inhibit voltage. Overshooting the inhibit voltage on the adjacent signal lines may result in increasing a time necessary to successfully program memory cells coupled to the target signal line, and thereby increase duration of a program operation.

DETAILED DESCRIPTION

Certain details are set forth below to provide a sufficient understanding of embodiments of the invention. However, it will be clear to one having skill in the art that embodiments of the invention may be practiced without these particular details. Moreover, the particular embodiments of the present invention described herein are provided by way of example and should not be used to limit the scope of the invention to these particular embodiments.

Figure 1:
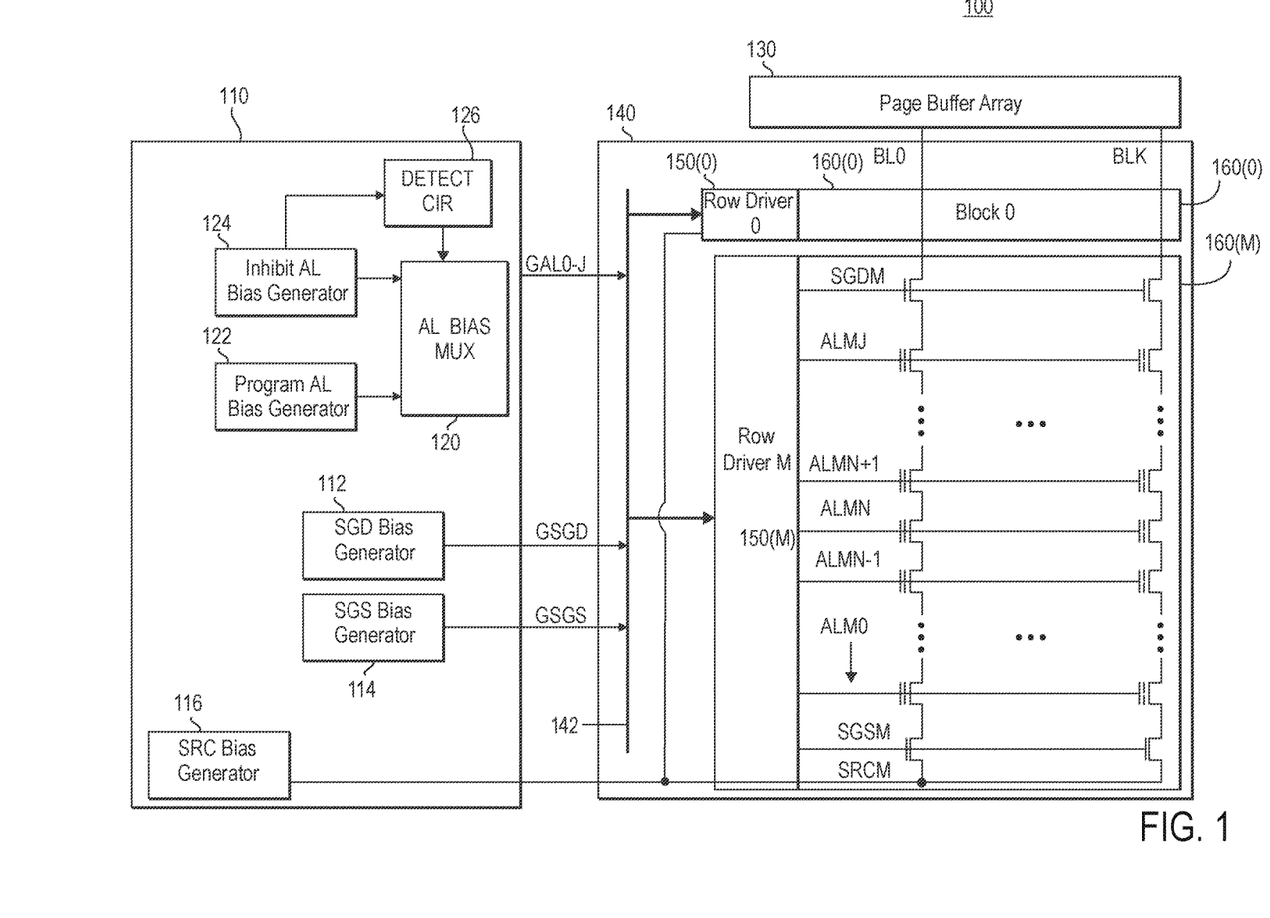
FIG. 1 is a diagram of a particular illustrative embodiment of an apparatus including a memory access circuit, according to an embodiment of the disclosure.

Referring to FIG. 1, a particular illustrative embodiment of an apparatus (e.g., an integrated circuit, a memory device, a memory system, an electronic device or system, a smart phone, a tablet, a computer, a server, etc.) including a memory access circuit is disclosed and generally designated 100. The apparatus 100 may include a memory access circuit 110 coupled to a memory array 140 via global access and select lines (e.g., GAL0-J access lines and GSGD and GSGS lines). The memory array 140 may comprise one or more memory blocks 160(0-M) of the memory array 140. The memory array 140 may be coupled to row drivers 150(0-M), each of which is coupled to a respective memory block 160(0-M) to provide voltages on respective access and select lines during memory access operations associated with memory cells coupled to the AL00-MJ access lines. The memory access circuit 110 may include circuitry (e.g., a detection circuit 126 and a access line bias multiplexer 120) that provides an inhibit voltage (e.g., a first voltage) to the GAL0-J access lines and provides a program voltage (e.g., a second voltage) to a target access line of the GAL0-J access lines responsive to determining that one or more of the access lines ALM0-MJ are biased to a threshold voltage. In some embodiments, the threshold voltage is less than the first voltage. By providing the program voltage to a target access line based on a determination that the access lines have reached the threshold voltage, which is less than an inhibit voltage, overshooting of the inhibit voltage along adjacent access lines may be limited or prevented. Limiting or preventing overshoot of the inhibit voltage on adjacent access lines may reduce a time necessary to program target memory cells coupled to the target access line. The GAL0-J access lines are coupled to a memory access bus 142 of the memory array 140.

An inhibit access line bias generator 124 and a program access line bias generator 122 of the memory access circuit 110 may each include a high voltage generator circuit (not shown in FIG. 1) having a pump and a voltage regulator using a negative feedback loop to control the inhibit voltage and the program voltage, respectively. The memory access circuit 110 may further include an access line bias multiplexer 120 that selectively provides one of the first voltage from an inhibit access line bias generator 124 or the second voltage from a program access line bias generator 122 onto the GAL0-J access lines. The detection circuit 126 may provide a signal to the access line bias multiplexer 120 to control selection of the inhibit voltage from the inhibit access line bias generator 124 or the program voltage from the program access line bias generator 122 by the access line bias multiplexer 120 based on a determination of whether an access line voltage exceeds a threshold during a program operation. In some embodiments, rather than detecting a voltage of the respective AL00-MJ access lines of the memory blocks 160(0-M), the detection circuit 126 may compare a detection voltage from the inhibit access line bias generator 124 (e.g., such as the feedback voltage of the negative feedback loop) with a reference voltage to determine whether the respective AL00-MJ access lines have reached the threshold voltage. The detection voltage may be indicative of a voltage of an access line of the memory blocks 160(0-M). In some embodiments, the threshold voltage is equal to the reference voltage. In other embodiments, the threshold and reference voltages are different. For example, during a program operation, while the detection circuit 126 detects that a detection voltage of the inhibit access line bias generator 124 is less than a reference voltage (e.g., indicating that the voltages of the respective AL00-MJ access lines are less than the threshold voltage), the access line bias multiplexer 120 may provide the inhibit voltage from the inhibit access line bias generator 124 to all GAL0-J access lines. Further, the access line bias multiplexer 120 may provide the program voltage to a target global access line of the GAL0-J access lines when the detection circuit 126 detects that the detection voltage of the inhibit access line bias generator 124 is equal to or greater than the reference voltage (e.g., indicating that the voltages of the access lines are equal to or greater than the threshold voltage).

The memory access circuit 110 may further include a select-gate-drain SGD bias generator 112 to provide a SGD activation voltage on a global SGD signal line GSGD and a select-gate-source SGS bias generator 114 to provide a SGS activation voltage on a global SGS signal line GSGS to the memory access bus 142 of the memory array 140. The memory access circuit 110 may further include a SRC bias generator 116 that biases the SRC source of each of the memory blocks 160(0-M) of the memory array 140. In some embodiments, the bias of the SRC bias generator 116 may be a ground or near ground voltage. In other embodiments, the bias of the SRC bias generator 116 may be a negative voltage.

The memory access bus 142 provides voltages of the GAL0-J access lines and the GSGD and GSGS lines to one or more of the row drivers 150(0-M) based on a target memory block of the memory blocks 160(0-M) associated with a memory access operation. For example, the memory access bus 142 may selectively provide voltages of the GAL0-J access lines and the GSGS and GSGD lines to one or more of the row drivers 150(0-M) during a memory access operation. The row drivers 150(0-M) may drive voltages on the respective AL00-MJ access lines, SGD0-M and SGS0-M lines of the memory blocks 160(0-M) during memory access operations. The AL00-MJ access lines of the memory blocks 160(0-M) may each be coupled to gates of a respective row of memory cells. Each bitline BL0-K of the memory array 140 may be coupled to a respective string of memory cells across all memory blocks 160(0-M). Each row of memory cells form a respective page including K+1 memory cells. Thus, each memory block 160(0-M) includes J+1 memory cell pages, with K+1 memory cells in each page. A page buffer array 130 may be coupled to bitlines BL0-K to receive data stored by one or more memory cells of a respective memory block 160(0-M) during a read access operation. In some examples, a row of memory cells may include a plurality of memory cells. Moreover, a plurality of memory cells may comprise either a row of memory cells and/or a column of memory cells. Accordingly, although examples described herein are directed to targeted rows of memory cells, it will be appreciated that described examples may be applied to columns of memory cells as well. In this manner, embodiments described herein may be applied to a plurality of memory cells configured in any arrangement, such as in a row, column, fat row (e.g., multiple rows), fat column (multiple columns), or combination thereof. In an embodiment, each of the memory cells may be a non-volatile memory cell. Each of the memory cells may be coupled (e.g. either directly, as in the case of a NOR architecture, or indirectly, as in the case of a NAND architecture) to a source.

While only memory block 160(M) is depicted in detail in FIG. 1, the other memory blocks 160(0-M−1) may include the same architecture as memory block 160(M). In the interest of clarity, the following discussion will be based on a memory program operation to program one or more memory cells along the ALMN access line in memory block 160(M). It will be appreciated that similar memory access operations may be performed on other memory cells of memory block 160(M) and/or memory cells of memory blocks 160(0-M−1). Thus, during a programming operation targeting the ALMN access line of the memory block 160(M), the row driver 150(M) may provide the voltages of the GAL0-J access lines and the GSGD and GSGS lines to the ALM0-MJ access lines, and the SGDM and SGSM lines, respectively.

During a program operation associated with a page of memory cells coupled to the ALMN access line of the memory block 160(M), the memory access circuit 110 may provide an inhibit voltage to the ALM0-MJ access lines (e.g., via the GAL0-J access lines and via the memory access bus 142 and the row driver 150(M)) to begin precharging the ALM0-MJ access lines. Responsive to determining that the voltage of the ALM0-MJ access lines have reached a threshold voltage, the memory access circuit 110 may provide a program voltage to the ALMN access line (e.g., via the GALN access line and via the memory access bus 142 and the row driver 150(M)) to program one or more memory cells coupled to the ALMN access line. While the program voltage is provided to the ALMN line, the inhibit voltage continues to be provided to the other ALM0-MN−1 and ALMN+1-MJ access lines. The threshold voltage may be less than the inhibit voltage and the program voltage may be greater than the inhibit voltage. Due to parasitic coupling between the ALM0-MJ access lines, provision of the program voltage to the ALMN access line may cause voltages of the adjacent ALMN−1 and ALMN+1 access lines to increase. Thus, by providing the program voltage prior to the ALM0-MJ access lines reaching the inhibit voltage (e.g., responsive to the ALM0-MJ access lines reaching the threshold voltage), exceeding or overshooting of the inhibit voltage on the adjacent ALMN−1 and ALMN+1 access lines may be prevented or limited. Overshooting the inhibit voltage on the adjacent ALMN−1 and ALMN+1 access lines may require the program voltage to be provided to the ALMN access line longer in order to successfully program the memory cells coupled to the ALMN access line. Thus, by preventing or limiting overshooting of the inhibit voltage on the ALM0-MJ access lines, the total program time may be reduced, as compared with an overshoot occurring. In some examples, the difference between the inhibit voltage and the detect voltage is equal to a voltage increase on the ALM0-MJ access lines above the inhibit voltage caused by the parasitic coupling between the ALM0-MJ access lines. In some embodiments, the inhibit voltage is in a range including and between 8 to 12 volts. In one example, the threshold voltage may be 10-20% less than the inhibit voltage. In other examples, the inhibit voltage may be more than 20% less than the inhibit voltage. Further, the program voltage may be in a range including and between 16 and 20 volts.

Programming a flash memory cell includes driving electrons into or out of a charge storage structure, such as a floating gate or charge trap, of the memory cell to change a threshold voltage of the memory cell. This may require a large voltage differential between the gate and the source of the memory cell. In some examples, this includes providing a lower voltage at the source of the memory cell and a higher voltage at the gate of the memory cell, which may allow the electrons to flow to the charge storage structure. Thus, during the program operation associated with a page of memory cells coupled to the access line ALMN of the memory block 160(M), the SRC source may be biased to a low voltage (e.g., a lower voltage than the inhibit or program voltages, such as a ground voltage) via the SRC bias generator 116. The SGS bias generator 114 may provide the SGS activation voltage to the memory access bus 142 via the GSGS line, and the memory access bus 142 may provide the SGS activation voltage from the GSGS line to the row driver 150(M), which provides the SGS activation voltage to the SGSM line. The SRC bias generator 116 may provide the source bias voltage to the SRCM source.

As previously described, the inhibit access line bias generator 124 may provide the inhibit voltage to the access line bias multiplexer 120 and the program access line bias generator 122 may provide the program voltage to the access line bias multiplexer 120. The access line bias multiplexer 120 may selectively provide the inhibit voltage or the program voltage to the GAL0-J access lines based on a determination of whether the voltages of the ALM0-MJ access lines equal or exceed a threshold voltage, as determined by the detection circuit 126. The threshold voltage may be less than the inhibit voltage. For example, an output of the detection circuit 126 may be based on a comparison of a detection voltage of the inhibit access line bias generator 124 with a reference voltage. The detection voltage may be indicative of the voltages of the ALM0-MJ access lines. In some examples, the reference voltage may be equal to the threshold voltage. In one example, the reference voltage may be 10-20% less than the inhibit voltage. In other examples, the reference voltage may be more than 20% less than the inhibit voltage. When the output of the detection circuit 126 indicates that the detection voltage of the inhibit access line bias generator 124 is less than the reference voltage, the access line bias multiplexer 120 may provide the inhibit voltage to each of the GAL0-J access lines. When the output of the detection circuit 126 indicates that the detection voltage of the detection circuit 126 is equal to or exceeds the reference voltage, the access line bias multiplexer 120 may provide the inhibit voltage to each of the GAL0-N−1 and GALN+1-J access lines, and the program voltage on the GALN access line.

As previously described, the voltage on the GAL0-J access lines are provided to the corresponding ALM0-MJ access lines via the memory access bus 142 and the row driver 150(M). Precharging the ALM0-MJ access lines to the inhibit voltage activates the memory cells, and providing the program voltage to the ALMN access line creates a gate-source voltage differential that allows programming of memory cells coupled to the ALMN access line. The program voltage may be provided to the ALMN access line for a particular (e.g. predetermined) period of time, and after the particular period of time has elapsed, the inhibit and program voltages provided to the ALM0-MJ access lines may be cleared (e.g. removed). As previously described, transitioning to provision of the program voltage to the ALMN access line based on a threshold voltage that is less than the inhibit voltage may prevent or limit an overshoot of the inhibit voltage on other ALM0-N−1 and ALMN+1-MJ access lines, which may reduce program time.

Figure 2:
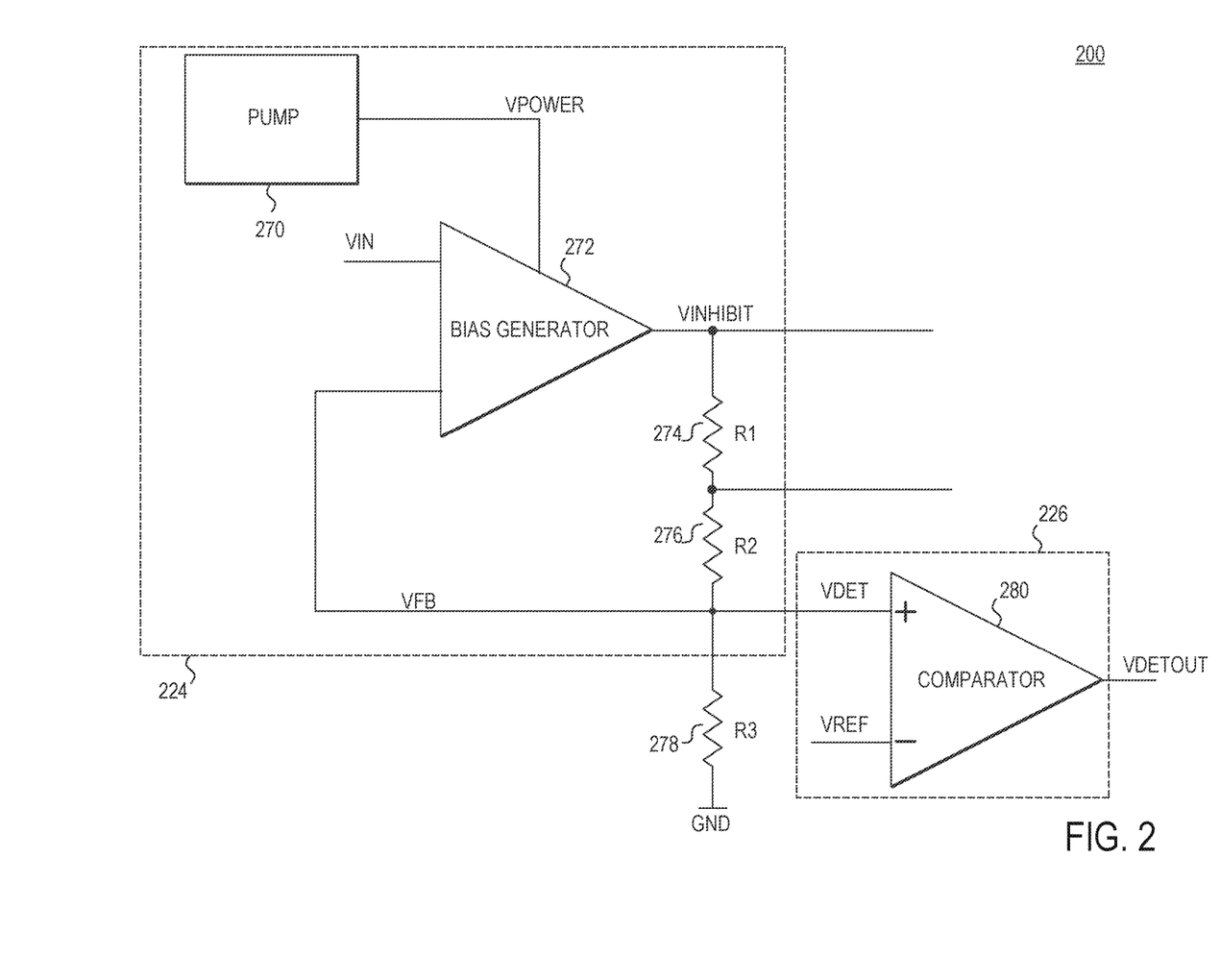
FIG. 2 is a diagram of a particular illustrative embodiment of an apparatus including an inhibit access line bias generator and a detection circuit, according to an embodiment of the disclosure.

Referring to FIG. 2, an apparatus 200 including an inhibit access line bias generator 224 and a detection circuit 226 according to an embodiment of the invention is disclosed. The inhibit access line bias generator 224 may provide an inhibit voltage signal VINHIBIT at an output, and the detection circuit 226 may compare a detection voltage signal VDET of the inhibit access line bias generator 224 with a reference voltage signal VREF to provide a detection output signal VDETOUT. The inhibit access line bias generator 124 of FIG. 1 may include the inhibit access line bias generator 224. The detection circuit 126 of FIG. 1 may include the detection circuit 226.

The inhibit access line bias generator 224 may include a bias generator 272 that provides the VINHIBIT signal based on a comparison between an input signal VIN and a feedback voltage signal VFB. The VIN signal may be coupled to a first input (e.g., a non-inverting input) of the bias generator 272. The VFB signal may be coupled to a second input (e.g., an inverting input) of the bias generator 272 via a negative feedback loop that includes a resistor divider network (e.g., resistors R1 274, R2 276, and R3 278 coupled in series between an output of the bias generator 272 and a ground node). In some embodiments, the VFB signal may be provided to the second input of the bias generator 272 from a node between the resistor R2 276 and the resistor R3 278. The bias generator 272 may be driven by a voltage pump 270 that provides a power signal VPOWER to drive the VINHIBIT signal. The bias generator 272 may be an operational amplifier or differential amplifier that regulates the voltage of the VINHIBIT signal.

The detection circuit 226 may include a comparator 280 that receives the VDET signal at a first input (e.g., a non-inverting input) and the VREF signal at a second input (e.g., an inverting input). The comparator 280 may provide VDETOUT signal at an output based on a comparison between the VDET signal and the VREF signal. The comparator 280 may be an operational amplifier or other type of comparator. In some embodiments, the VDET signal may be received from the inhibit access line bias generator 224. For example, the VDET voltage may be received from a node between the resistor R2 276 and the resistor R3 278. In this example, the VREF signal used to compare at the comparator 280 may be equal to the threshold voltage described with reference to FIG. 1. In another example, the VDET signal may be received from a node between the resistor R1 274 and the resistor R2 276. In some embodiments, the relative resistance values of the R1 274, R2 276, and R3 278 may be such that selection of a node to provide the VDET voltage may result in the VREF signal being equal to the VIN signal. The VDETOUT signal may be provided to an access line bias multiplexer, such as the access line bias multiplexer 120 of FIG. 1, to control when a program voltage should be applied to a target access line.

In operation, the voltage pump 270 may provide the VPOWER signal to the bias generator 272, and the VIN signal may be received at the bias generator 272. The bias generator 272 may provide the VINHIBIT signal at an output, which is regulated by the VFB signal received via the feedback loop that includes the resistors R1 274, R2 276, and R3 278. The comparator 280 may receive the VDET signal from the inhibit access line bias generator 224 and further receive the VREF signal, and may provide the VDETOUT signal at an output having a value based on a comparison between the VDET signal and the VREF signal. For example, the VDETOUT signal may have a first value when the VINHIBIT is less than VREF*((R1+R2+R3)/R3). The VDETOUT signal may transition to a second value when the VINHIBIT becomes equal to or greater than VREF*((R1+R2+R3)/R3). Based on the transition of the VDETOUT signal to the second value, the access line bias multiplexer (e.g., the access line bias multiplexer 120 of FIG. 1) may provide the program voltage to a target access line.

It is appreciated that the VDET signal and the value of the VREF signal may have different values than previously described, and that the relationship between the VDET signal and the VREF signal is such that the VDET signal and the VREF signal becoming equal indicates that a voltage on an access line has reached the threshold voltage that triggers a transition to provision of the program voltage to a target access line. It is appreciated that the values of the resistor R1 274, resistor R2 276, and resistor R3 278 may be set to approximate impedances of the GAL0-J access lines and/or impedances of the ALM0-MJ access lines of FIG. 1, in some examples. In other examples, the values of the resistor R1 274, resistor R2 276, and resistor R3 278 may not be related to the impedances of access lines of FIG. 1. The inhibit access line bias generator 224 and the detection circuit 226 are exemplary, and other circuit designs may be used to implement the inhibit access line bias generator 124 and the detection circuit 126 of FIG. 1.

Figure 3:
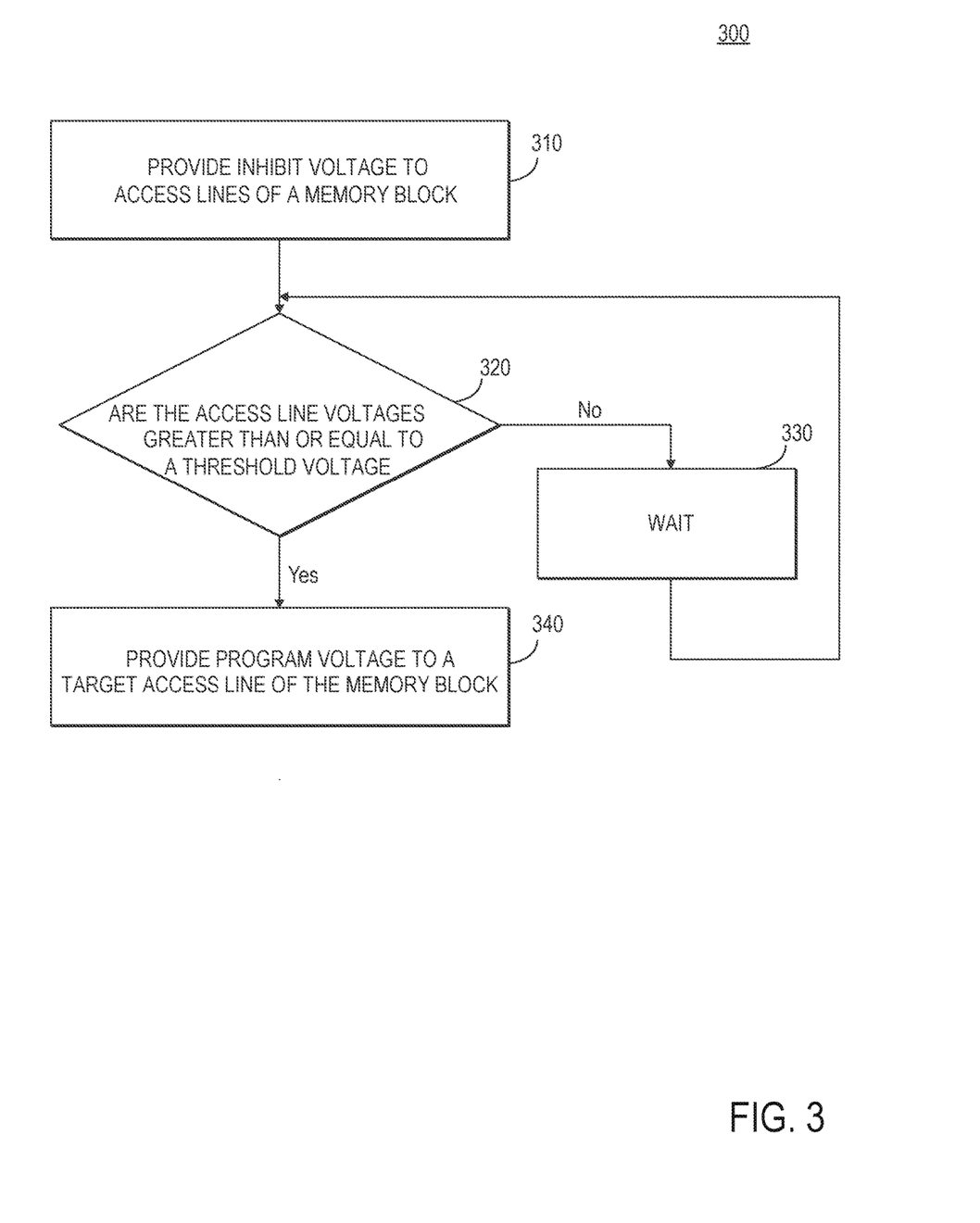
FIG. 3 is a flowchart of a method for programming memory cells of a memory block, according to an embodiment of the disclosure.

FIG. 3 is a flowchart for a method 300 for programming memory cells of a memory block according to an embodiment of the disclosure. The method 300 illustrated by the flowchart may be implemented by the memory access circuit 110 of FIG. 1.

The method 300 may include providing an inhibit voltage to the access lines of a memory block, such as ALM0-MJ access lines of memory block 160(M) of FIG. 1, at 310. Providing the inhibit voltage to all access lines of the memory block may include providing the inhibit voltage on global access lines via an access line bias multiplexer, such as the access line bias multiplexer 120 of FIG. 1. Providing the inhibit voltage to all access lines of the memory block may further include providing the inhibit voltage to a row driver via a memory access bus, such as to the row driver 150(M) via the memory access bus 142 of FIG. 1, where the row driver provides the inhibit voltage to the access lines. The inhibit voltage may be generated by an inhibit access line bias generator, such as the inhibit access line bias generator 124 of FIG. 1 and/or the inhibit access line bias generator 224 of FIG. 2.

The method 320 may further include determining whether voltages at the access line are greater than or equal to a threshold voltage, at 320. Determining whether voltages at the access line are greater than or equal to a threshold voltage may include comparing a detection voltage of a feedback loop of the inhibit access line bias generator with a reference voltage. The detection voltage may be indicative of the threshold voltage. While the access line voltages are determined to be less than the threshold voltage, the method 300 further includes waiting, at 330. When the access line voltages are determined to be equal to or greater than the threshold voltage, the method 300 further includes providing a program voltage to a target access line of the memory block, at 340. Providing the program voltage to the target access line of the memory block may include providing the program voltage on a target global access line via the access line bias multiplexer. Providing the program voltage to the target access lines of the memory block may further include providing the program voltage to the row driver via the memory access bus, where the row driver provides the program voltage to the target access line. The program voltage may be generated by the program access line bias generator 122 of FIG. 1.

In some embodiments, the method 300 may further include holding the program voltage on the target access line and the inhibit voltage on the other access lines of the memory block for a particular length of time. In some embodiments, the method 300 may further include clearing the program and inhibit voltages provided to the wordlines of the memory block after the particular length of time has elapsed.

Figure 4:
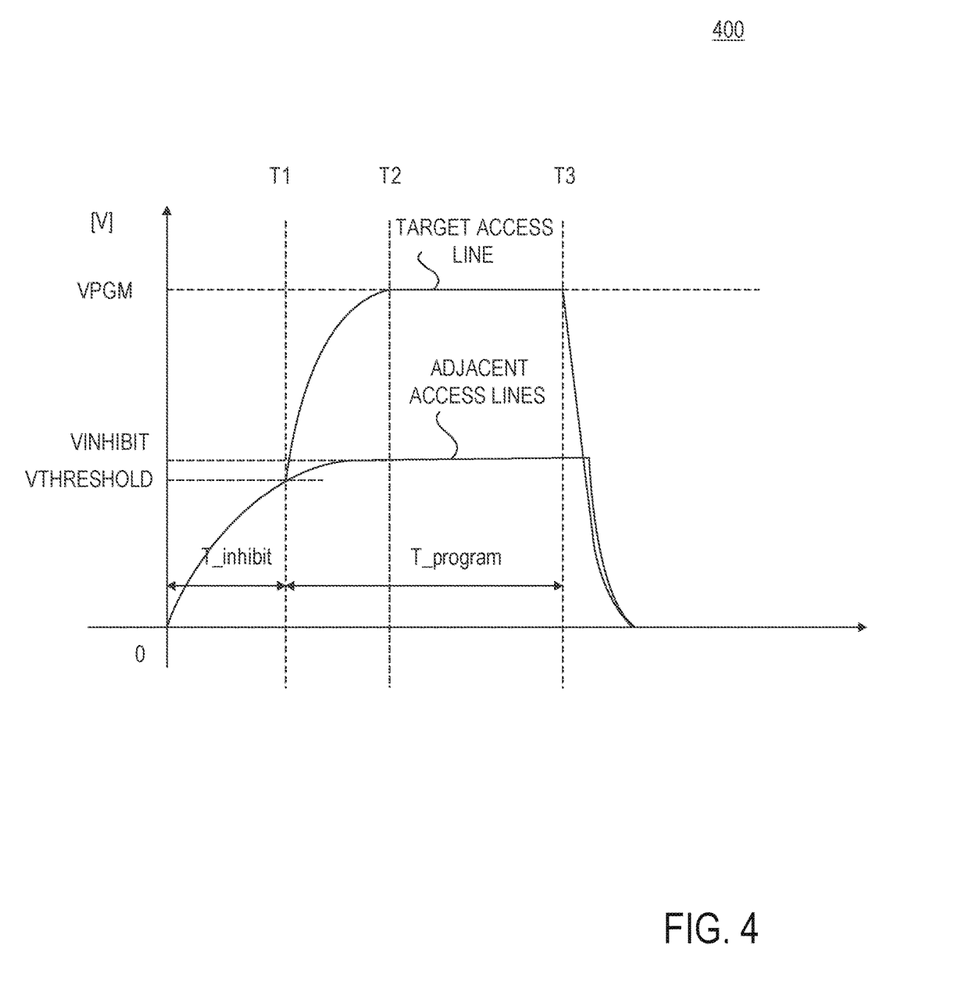
FIG. 4 is an exemplary timing diagram of access line voltages of a memory block during a program operation, according to an embodiment of the disclosure.

Referring to FIG. 4, an exemplary timing diagram of voltages of access lines of a memory block during a program operation, is disclosed and generally designated 400. For example, the exemplary timing diagram 400 may illustrate timing characteristics of voltages of the ALM0-MJ access lines of the memory block 160(M) of FIG. 1.

In the exemplary timing diagram 400, between times T0 and T1, the voltages of the access lines of the memory block are charged toward an inhibit voltage VINHIBIT. At time T1, the access lines reach a threshold voltage VTHRESHOLD. When the access lines reach the VTHRESHOLD voltage, a program voltage VPGM is provided to a target access line, as the other access lines are continued to be charged to the VINHIBIT voltage. Between times T1 and 12, the target access line is charged to the VPGM voltage and the other access lines continue to be charge toward, without overshooting, the VINHIBIT voltage. At time T2, the target access line reaches the VPGM voltage, so that the memory cells coupled to the target access line may be programmed. The target access line is held at the VPGM voltage between times T2 and T3. After time T3, the voltages provided to the access lines are cleared, and the access lines discharge toward a reference voltage, such as ground. By providing the VPGM voltage to the target access line when the access lines reach the VTHRESHOLD voltage, overshooting the VINHIBIT voltage on the other access lines may be prevented or limited. By preventing or limiting overshoot of the inhibit voltage by the other access lines, the program time between times T1 and 13 may be reduced as compared to an overshoot of the inhibit voltage occurring.

The exemplary timing diagram 400 is a non-limiting illustration to provide a sufficient understanding of embodiments of the disclosure. Those of ordinary skill in the art will appreciate that the relative timing of the signals of the exemplary timing diagram 400 may vary from system to system. For example, the relative timing of charging the access lines may vary from the timing depicted. Also, the other access lines may slightly overshoot the VINHIBIT voltage when the program voltage is applied to the target access line.

Figure 5:
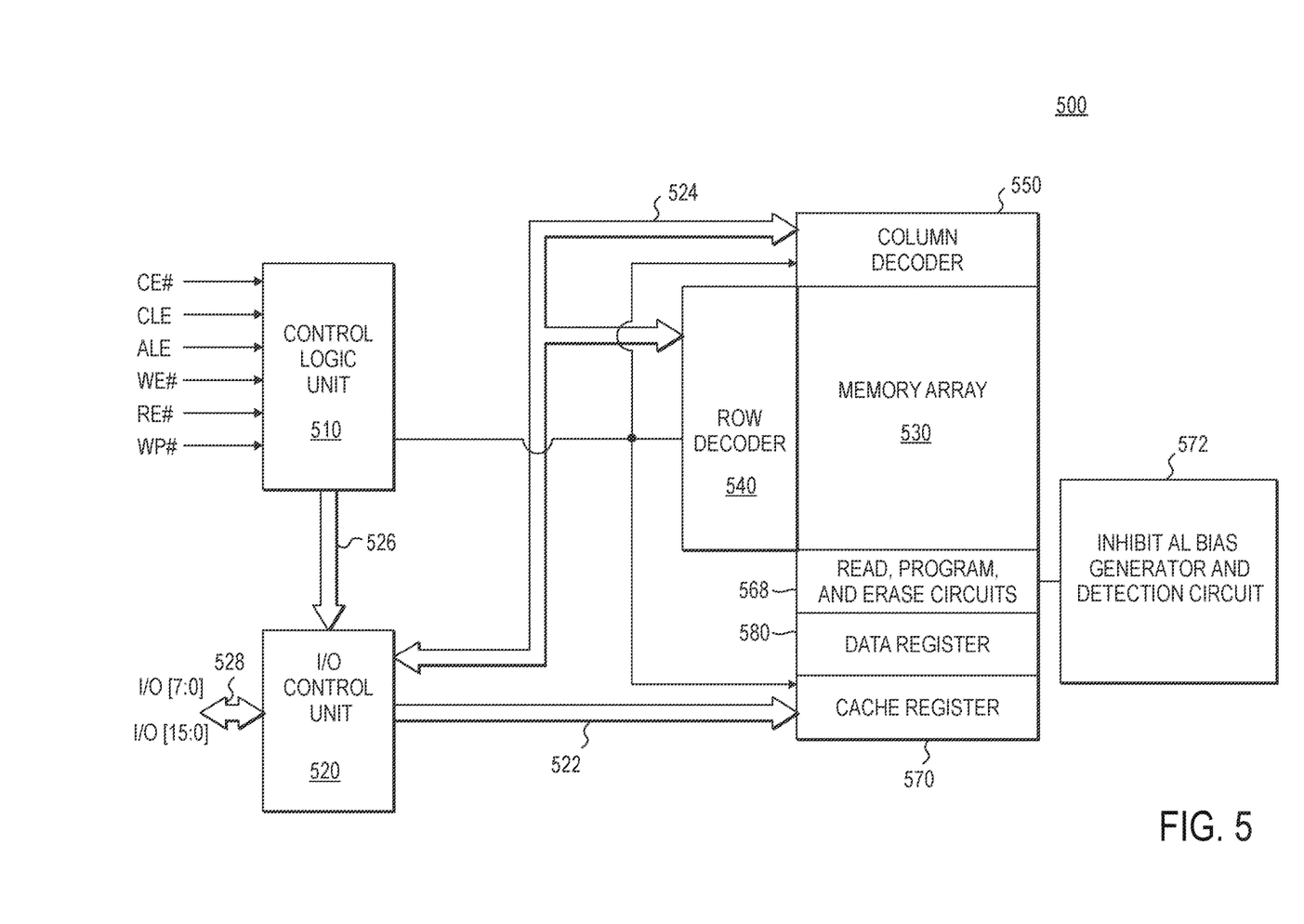
FIG. 5 is a diagram of a memory according to an embodiment of the disclosure.

FIG. 5 illustrates a memory 500 according to an embodiment of the present invention. The memory 500 includes a memory array 530 with a plurality of memory cells. The memory cells may be non-volatile memory cells, such as NAND flash cells, or may generally be any type of memory cells.

Command signals, address signals and write data signals may be provided to the memory 500 as sets of sequential input/output ("I/O") signals transmitted through an I/O bus 528. Similarly, read data signals may be provided from the memory 500 through the I/O bus 528. The I/O bus 528 is connected to an I/O control unit 520 that routes the signals between the I/O bus 528 and an internal data bus 522, an internal address bus 524, and an internal command bus 526.

The memory 500 also includes a control logic unit 510 that receives a number of control signals either externally or through the internal command bus 526 to control the operation of the memory 500.

The internal address bus 524 applies block-row address signals to a row decoder 540 and column address signals to a column decoder 550. The row decoder 540 and column decoder 550 may be used to select blocks of memory or memory cells for memory operations, for example, read, program, and erase operations. The column decoder 550 may enable write data signals to be applied to columns of memory corresponding to the column address signals and allow read data signals to be coupled from columns corresponding to the column address signals.

In response to the memory commands decoded by the control logic unit 510, the memory cells in the memory array 530 are read, programmed, or erased. Read, program, erase circuits 568 coupled to the memory array 530 receive control signals from the control logic unit 510 and include voltage generators for generating various pumped voltages for read, program and erase operations. The read, program, erase circuits 568 may include the row drivers 150(0-M) of FIG. 1. An inhibit access line bias generator and detection circuit 572 is coupled to the read, program, and erase circuits 568. The inhibit access line bias generator and detection circuit 572 may include embodiments of the present invention, including the memory access circuit 110 and/or the inhibit access line bias generator 124, detection circuit 126, and access line bias multiplexer 120 of FIG. 1, the apparatus 200 of FIG. 2, and/or may be used to implement the method 300 of FIG. 3. The inhibit access line bias generator and detection circuit 572 in some embodiments detects when a threshold voltage of access lines of a memory block of the memory array 530 exceed a threshold voltage for the read, program, and erase circuits 568 to provide a program voltage to a target access line.

After the row address signals have been applied to the internal address bus 524, the I/O control unit 520 routes write data signals to a cache register 570. The write data signals are stored in the cache register 570 in successive sets each having a size corresponding to the width of the I/O bus 528. The cache register 570 sequentially stores the sets of write data signals for an entire row or page of memory cells in the memory array 530. All of the stored write data signals are then used to program a row or page of memory cells in the memory array 530 selected by the block-row address coupled through the internal address bus 524. In a similar manner, during a read operation, data signals from a row or block of memory cells selected by the block-row address coupled through the internal address bus 524 are stored in a data register 580. Sets of data signals corresponding in size to the width of the I/O bus 528 are then sequentially transferred through the I/O control unit 520 from the data register 580 to the I/O bus 528.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method, comprising:
providing a common inhibit voltage to a plurality of access lines;
determining whether an access line of the plurality of access lines has reached a voltage equal to or greater than a threshold voltage, wherein the threshold voltage is different from the common inhibit voltage;
responsive to a determination that the access line of the plurality of access lines has reached the voltage equal to or greater than the threshold voltage, providing a program voltage to a target access line of the plurality of access lines, wherein the program voltage is higher than the common inhibit voltage, and the threshold voltage is not a voltage held for a length of time on the access line of the plurality of access lines before the providing of the program voltage; and
holding the program voltage on the target access line.

2. The method of claim 1, further comprising clearing the program voltage provided to the target access line and common inhibit voltage provided to the other access lines in the plurality of access lines after a time period has elapsed.

3. The method of claim 1, further comprising:
responsive to the determination that the access line of the plurality of access lines has reached the voltage equal to or greater than the threshold voltage, providing the common inhibit voltage to at least other access lines of the plurality of access lines.

4. The method of claim 1, wherein determining whether the access line of the plurality of access lines has reached the voltage equal to or greater than the threshold voltage comprises comparing a detection voltage of a feedback loop of a bias generator with a reference voltage.

5. The method of claim 4, wherein the detection voltage is indicative of respective voltages of the plurality of access lines.

6. The method of claim 4, wherein the reference voltage is equal to the threshold voltage.

7. The method of claim 4, wherein providing the program voltage to the target access line of the plurality of access lines comprises:
receiving, at a multiplexer, the common inhibit voltage and the program voltage; and
selectively providing the program voltage responsive to the detection voltage indicating that the detection voltage exceeds the threshold voltage.

8. The method of claim 1, wherein the threshold voltage is less than the common inhibit voltage.

9. The method of claim 1 further comprising holding the common inhibit voltage on other access lines of the plurality of access lines during holding the program voltage on the target access line.

10. An apparatus comprising:
a memory array comprising a plurality of access lines; and
an access circuit configured to provide a first voltage to the plurality of access lines, to determine whether at least one access line of the plurality of access lines has reached a threshold voltage that is less than the first voltage, to provide a second voltage higher than the first voltage to target access line of the plurality of access lines responsive to determining that the at least one access line of the plurality of access lines has reached the threshold voltage, and to hold the second voltage on the target access line of the plurality of access lines, wherein the access line of the plurality of access lines is not held at the threshold voltage for a time period before the holding of the second voltage.

11. The apparatus of claim 10, wherein the access circuit is further configured to provide the first voltage to other access lines of the plurality of access lines while the second voltage is being held on the target access line.

12. The apparatus of claim 11, wherein the second voltage on the target access line is held for a length of time.

13. The apparatus of claim 12, wherein the access circuit is further configured to hold the first voltage on the other access lines of the plurality of access lines during the length of time.

14. The apparatus of claim 12, wherein, the access circuit is further configured to clear the second voltage provided to the at least one access line plurality of access lines after the length of time has elapsed.

15. The apparatus of claim 14, wherein the plurality of access lines, including the target access line, are discharged towards a reference voltage after the length of time has elapsed.

16. The apparatus of claim 10, wherein the memory access circuit comprises:
- a detector circuit configured to compare a voltage on the at least one access line of the plurality of access lines to the threshold voltage and to provide a detection voltage indicative of whether the at least one access line of the plurality of access lines has reached the threshold voltage; and
- a multiplexer configured to selectively provide the first or second voltage based on the detection output voltage.

17. A method, comprising:
- providing an inhibit voltage to a plurality of access lines;
- determining that an access line of the plurality of access lines has reached a threshold voltage before the access line of the plurality of access lines reaches the inhibit voltage, wherein the access line is not held at the threshold voltage upon reaching the threshold voltage; and
- providing a program voltage to the access line of the plurality of access lines in response to the determining, the program voltage is higher than the inhibit voltage; and
- holding the program voltage on the access line for a length of time.

18. The method of claim 17, further comprising:
- discharging the access line of the plurality of access lines towards a reference voltage after the length of time has elapsed.

19. The method of claim 17, further comprising:
- providing an inhibit voltage to other access lines of the plurality of access lines during the length of time, wherein the threshold voltage is different than the inhibit voltage provided to the other access lines.

20. The method of claim 18 further comprising holding the inhibit voltage on other access lines of the plurality of access lines during the length of time and discharging the other access lines towards a reference voltage after the length of time has elapsed.

* * * * *

UNITED STATES PATENT AND TRADEMARK OFFICE
CERTIFICATE OF CORRECTION

PATENT NO. : 10,366,728 B2
APPLICATION NO. : 15/910375
DATED : July 30, 2019
INVENTOR(S) : Jae-Kwan Park It is certified that error appears in the above-identified patent and that said Letters Patent is hereby corrected as shown below:

Column 10, Line 5-12, Claim 1:
Delete:
", providing a program voltage to a target access line of the plurality of access lines, wherein the program voltage is higher than the common inhibit voltage; and the threshold voltage is not a voltage held for a length of time on the access line of the plurality of access lines before the providing of the program voltage; and holding the program voltage on the target access line."
Insert:
--, immediately providing a program voltage to a target access line of the plurality of access lines, wherein the program voltage is higher than the common inhibit voltage; and
holding the program voltage on the target access line for a length of time.--

Signed and Sealed this
Sixteenth Day of February, 2021

Drew Hirshfeld
*Performing the Functions and Duties of the
Under Secretary of Commerce for Intellectual Property and
Director of the United States Patent and Trademark Office*